(12) United States Patent
Yoon et al.

(10) Patent No.: US 8,399,948 B2
(45) Date of Patent: Mar. 19, 2013

(54) LIGHT EMITTING DEVICE, LIGHT EMITTING DEVICE PACKAGE AND LIGHTING SYSTEM

(75) Inventors: Ho Sang Yoon, Seoul (KR); Sang Kyun Shim, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 204 days.

(21) Appl. No.: 12/945,333

(22) Filed: Nov. 12, 2010

(65) Prior Publication Data

US 2011/0133155 A1   Jun. 9, 2011

(30) Foreign Application Priority Data

Dec. 4, 2009  (KR) .................. 10-2009-0120180
Jul. 6, 2010  (KR) .................. 10-2010-0064948

(51) Int. Cl.
*H01L 31/00* (2006.01)
(52) U.S. Cl. .......... 257/449; 257/228; 257/488; 257/79; 257/E21.006; 257/E21.051; 257/E21.053; 257/E21.126; 257/E21.127; 257/E21.324; 257/E21.351
(58) Field of Classification Search .......... 257/449, 257/288, 79, 488, 15, 40, 88, 78, 292, 347, 257/E21.006, E21.051, E21.053, E21.17, 257/E21.126, E21.127, E21.324, E21.352
See application file for complete search history.

(56) References Cited

U.S. PATENT DOCUMENTS

| 6,903,731 B2 * | 6/2005 | Inukai | 345/204 |
|---|---|---|---|
| 7,046,240 B2 * | 5/2006 | Kimura | 345/212 |
| 2002/0182765 A1 | 12/2002 | Tran et al. | 438/29 |
| 2006/0268953 A1 | 11/2006 | Ikedo et al. | 372/43.01 |
| 2008/0006836 A1 | 1/2008 | Lee | 257/98 |
| 2008/0108162 A1 | 5/2008 | Dwilinski et al. | 438/46 |
| 2008/0123709 A1 | 5/2008 | Hersee | 372/45.011 |
| 2008/0142781 A1 | 6/2008 | Lee | 257/13 |
| 2008/0315180 A1 | 12/2008 | Kim et al. | |
| 2009/0206325 A1 | 8/2009 | Biwa et al. | 257/28 |

FOREIGN PATENT DOCUMENTS

| JP | 2007-080996 A | 3/2006 |
|---|---|---|
| JP | 2006-332258 A | 12/2006 |
| JP | 2009-283736 | 12/2009 |
| KR | 10-2001-0068216 A | 7/2001 |
| KR | 10-2001-0081005 A | 8/2001 |
| KR | 10-0324396 B1 | 7/2002 |
| KR | 10-2004-0049323 A | 6/2004 |
| KR | 10-2006-0035424 A | 4/2006 |
| KR | 10-0661709 B1 | 12/2006 |
| KR | 10-2008-0049869 A | 6/2008 |

(Continued)

OTHER PUBLICATIONS

Korean Office Action dated Dec. 8, 2010 issued in Application No. 10-2009-0120180.

(Continued)

*Primary Examiner* — David Nhu

(74) *Attorney, Agent, or Firm* — KED & Associates LLP (57) ABSTRACT

Disclosed are a light emitting device and a light emitting device package having the same. The light emitting device includes a first conductive type semiconductor layer; an active layer including a barrier layer and a well layer alternately disposed on the first conductive type semiconductor layer; and a second conductive type semiconductor layer on the active layer. At least one well layer includes an indium cluster having a density of $1E11/cm^2$ or more.

20 Claims, 6 Drawing Sheets

FOREIGN PATENT DOCUMENTS

| KR | 10-2008-0098812 A | 11/2008 |
|---|---|---|
| KR | 10-2009-0002190 A | 1/2009 |
| KR | 2009-0053550 | 5/2009 |
| KR | 2010-0062501 | 6/2009 |
| WO | WO 00/30178 A1 | 5/2000 |
| WO | WO 2006/068378 A1 | 6/2006 |

OTHER PUBLICATIONS

Korean Office Action dated Mar. 29, 2011 issued in Application No. 10-2009-0120180.

Lai, Yen-Lin, et al.; "Study of the Dominant Luminescence Mechanism in InGaN/GaN Multiple Quantum Wells Comprised of Ultrasmall InGaN Quasiquantum Dots"; Applied Physics Letters; American Institute of Physics; Melville, NY; vol. 86, No. 12, Mar. 17, 2005; pp. 121915-1-121915-3, (XP012064714).

Narukawa, Y. et al.; "Role of Self-Formed InGaN Quantum Dots for Exciton Localization in the Purple Laser Diode Emitting at 420 nm"; Applied Physics Letters; American Institute of Physics; Melville, NY; vol. 70, No. 8; Feb. 24, 1997; pp. 981-983; (XP012018420).

Kawakami, Y., et al.; "Recombination Dynamics of Localized Excitons in Self-Formed InGaN Quantum Dots"; Materials Science and Engineering; Elsevier; Sequoia, Lausanne, CH; vol. 50, No. 1-3; Dec. 18, 1997, pp. 256-263; (XP004119145).

Narukawa, Y. et al.; "Emission Mechanism of Localized Excitons in $In_xGa1-xN$ Single Quantum Wells"; Journal of Crystal Growth; Elsevier; Amsterdam, NL; vol. 189-190; Jun. 15, 1998; pp. 606-610; (XP004148585).

Ramaiah, K. et al.; "Studies of InGaN/GaN Multiquantum-Well Green-Light-Emitting Diodes Grown by Metalorganic Chemical Vapor Deposition"; Applied Physics Letters; American Institute of Physics; Melville, NY; vol. 85, No. 3; Jan. 1, 2004; pp. 401-403 (XP012063979).

Lai, Yen-Lin, et al.; "Tuning the Emitting Wavelength of InGaN/GaN Superlattices From Blue, Green to Yellow by Controlling the Size of InGaN Quasi-quantum Dot"; Thin Solid Films, Elsevier, Sequoia, S.A., Lausanne, CH; vol. 498, No. 1-2; Mar. 1, 2006; pp. 128-132; (XP025006527).

European Search Report dated Jul. 28, 2011 issued in Application No. 10 19 1313.

* cited by examiner

LIGHT EMITTING DEVICE, LIGHT EMITTING DEVICE PACKAGE AND LIGHTING SYSTEM

The present application claims priorities under 35 U.S.C. §119(a) of Korean Patent Application Nos. 10-2009-0120180 filed on Dec. 4, 2009 and 10-2010-0064948 filed on Jul. 6, 2010, which are hereby incorporated by reference in their entirety.

BACKGROUND

The embodiment relates to a semiconductor light emitting device and a light emitting device package having the same.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device. Particularly, a light emitting device including the group III nitride semiconductor has a direct fundamental bandgap corresponding to a visible ray band to an ultraviolet band so that light can be emitted with high efficiency.

The nitride semiconductor is mainly used for the LED (Light Emitting Diode) or an LD (laser diode), and studies have been continuously conducted to improve the manufacturing process or a light efficiency of the nitride semiconductor.

SUMMARY

The embodiment provides a light emitting device having a new active layer.

The embodiment provides a light emitting device including an active layer having a cluster with high indium density.

The embodiment provides a light emitting device including an active layer with improved surface defect density.

The embodiment can improve the reliability of a light emitting device, a light emitting device package and a lighting system.

An embodiment provides a light emitting device comprising: a first conductive type semiconductor layer; an active layer including a plurality of barrier layers and a plurality of well layers alternately disposed on the first conductive type semiconductor layer; and a second conductive type semiconductor layer on the active layer, wherein at least one well layer includes an indium cluster having a density of $1E11/cm^2$ or more.

An embodiment provides a light emitting device comprising: a first conductive type semiconductor layer; an active layer including a barrier layer and a well layer alternately disposed on the first conductive type semiconductor layer; and a second conductive type semiconductor layer on the active layer, wherein at least one well layer includes an indium cluster having a density of $1E11/cm^2$ or more, and a defect density on a surface of the active layer is lower than a defect density on a surface of the first conductive type semiconductor layer.

An embodiment provides a light emitting device package comprising; a body; a plurality of lead electrodes on the body; a light emitting device disposed on at least one of the lead electrodes and electrically connected to the lead electrodes; and a molding member for molding the light emitting device, wherein the light emitting device comprises: a first conductive type semiconductor layer; an active layer including a barrier layer and a well layer alternately disposed on the first conductive type semiconductor layer; and a second conductive type semiconductor layer on the active layer, and wherein at least one well layer includes an indium cluster having a density of $1E11/cm^2$ or more.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present.

Such a position of the layer will be described with reference to the drawings. In addition, the thickness of each layer shown in the drawings may be schematically drawn for the purpose of convenience or clarity. In addition, the size of elements does not utterly reflect an actual size.

Hereinafter, semiconductor light emitting devices according to the embodiments will be described with reference to accompanying drawings.

Figure 1:
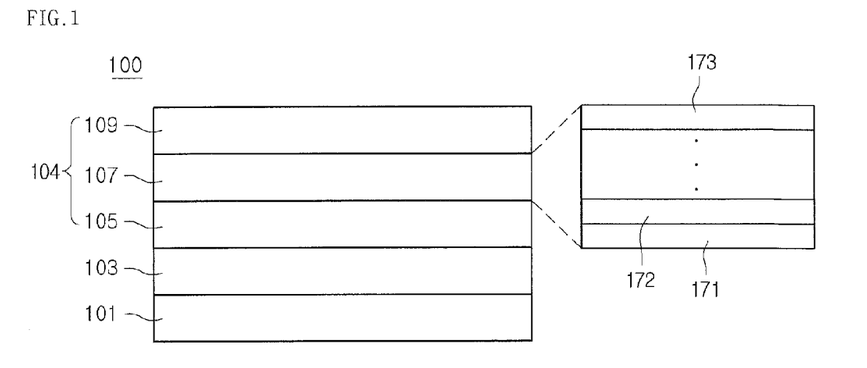
FIG. 1 is a sectional view showing a light emitting device according to the first embodiment.

FIG. 1 is a side sectional view showing a light emitting device according to the first embodiment.

Referring to FIG. 1, the light emitting device 100 includes a substrate 101, a buffer layer 103, a first conductive type semiconductor layer 105, an active layer 107 and a second conductive type semiconductor layer 109.

The substrate 101 may include a transmittive substrate, such as a sapphire (Al2O3) substrate or a glass substrate. The substrate 101 may include a conductive material, an insulating material or a metallic material. Preferably, the substrate 101 may include one selected from the group consisting of GaN, SiC, ZnO, Si, GaP, GaAs, and $Ga_2O_3$, but the embodiment is not limited thereto. A light extracting structure can be formed on the substrate 101. Preferably, the light extracting structure includes a protrusion having a lens structure or a stripe structure formed on the substrate 101. According to the embodiment, a group III nitride semiconductor crystalline structure is grown an epitaxial layer on the surface of the substrate, but the embodiment is not limited thereto.

In addition, a group II to VI compound semiconductor layer can be formed on the substrate 101 in the form of a layer or a pattern. The group II to VI compound semiconductor layer may include a light extracting structure or a structure including a material capable of decreasing the lattice mismatch.

The compound semiconductor layer can be grown by growth equipment, such as E-beam evaporator, PVD (physical vapor deposition), CVD (chemical vapor deposition), PLD (plasma laser deposition), dual-type thermal evaporator, sputtering, and MOCVD (metal organic chemical vapor deposition), but the embodiment is not limited to thereto.

A buffer layer 103 can be formed on the substrate 101. For instance, the buffer layer 103 may include group III-V compound semiconductor including one selected from the group consisting of GaN, AlN, AlGaN, InGaN, InN, InAlGaN, AlInN, AlGaAs, GaP, GaAs, GaAsP, and AlGaInP. The buffer layer can be formed by using a semiconductor material having the compositional formula of $In_xAl_yGa_{1-x-y}N$ ($0 \leq x \leq 1$, $0 \leq y \leq 1$, $0 \leq x+y \leq 1$) or by using an oxide material, such as ZnO. The buffer layer 103 may include a single layer or a super lattice structure (SLS) capable of decreasing the lattice mismatch between the substrate 101 and the compound semiconductor layer. The super lattice structure may include a stack structure of InGaN/GaN.

An undoped semiconductor layer, such as an undoped nitride semiconductor layer can be provided. The undoped semiconductor layer refers to a semiconductor layer, which is not doped with conductive dopant, intentionally. The undoped semiconductor layer has electric conductivity remarkably lower than that of the first conductive type semiconductor layer. For instance, the undoped semiconductor layer includes an undoped GaN layer having a first conductive property. The buffer layer 103 and/or the undoped semiconductor layer can be omitted.

A light emitting structure layer 104 is formed on the buffer layer 103. The light emitting structure layer 104 may have an N-P junction structure, a P-N junction structure, an N-P-N junction structure, or a P-N-P junction structure, wherein "N" refers to an N type semiconductor layer, "P" refers to a P type semiconductor layer, and "-" refers to a structure having the N type semiconductor layer and the P type semiconductor structure disposed at both sides of the active layer or stacked directly on the active layer.

Preferably, the light emitting structure 104 includes the first conductive type semiconductor layer 105, the active layer 107 and the second conductive type semiconductor layer 109.

The first conductive type semiconductor layer 105 can be disposed between the active layer 107 and the substrate 101, preferably, on the buffer layer 103. The first conductive type semiconductor layer 105 may include the group III-V compound semiconductor doped with the first conductive dopant. For instance, the first conductive type semiconductor layer 105 may include one selected from the group consisting of GaN, AlN, AlGaN, InGaN, InN, InAlGaN, AlInN, AlGaAs, GaP, GaAs, GaAsP, and AlGaInP. The first conductive type semiconductor layer 105 may include the semiconductor material having the compositional formula of $In_xAl_yGa_{1-x-y}N$ ($0 \leq x \leq 1$, $0 \leq y \leq 1$, $0 \leq x+y \leq 1$).

The first conductive type semiconductor layer 105 is an N type semiconductor layer. The N type semiconductor layer may include N type dopant, such as Si, Ge, Sn, Se or Te. The first conductive type semiconductor layer 105 may serve as an electrode contact layer and can be prepared as a single layer or a multiple layer, but the embodiment is not limited thereto.

In addition, the first conductive type semiconductor layer 105 may include a super lattice structure including heterojunction semiconductor layers. The super lattice structure includes the stack structure of GaN/InGaN or GaN/AlGaN. The super lattice structure may include at least two pairs of hetero junction semiconductor layers, which are alternately stacked with each other and have a thickness of few Å or more.

A first conductive clad layer can be formed between the first conductive type semiconductor layer 105 and the active layer 107. The first conductive clad layer may include a GaN-based semiconductor and have a bandgap greater than that of barrier layers 171 and 173 formed in the active layer 107 to confine the carrier.

The active layer 107 may have a single quantum well structure or a multiple quantum well structure. The active layer 107 may have a stack structure including a well layer 171 and a barrier layer 173, which are made from group III-V compound semiconductor materials. For instance, the active layer 107 may include an $In_aAl_bGa_{(1-a-b)}N$ barrier layer 171/ an $In_xAl_yGa_{(1-x-y)}N$ well layer 172, wherein $0 \leq a \leq 1$, $0 \leq b \leq 1$, $0 \leq a+b \leq 1$, $0 < x \leq 1$, $0 \leq y \leq 1$, and $0 \leq x+y \leq 1$. The barrier layer 171 and the well layer 172 can be repeatedly stacked by one to twenty times, but the embodiment is not limited thereto. The barrier layers 171 and 173 can be disposed at the uppermost side and the lowermost side of the active layer 107, respectively, and the number of the barrier layers 171 may be more than the number of well layers 172 by at least one, but the embodiment is not limited thereto.

The first barrier layer 171 of the active layer 107 adjacent to the first conductive type semiconductor layer 105 can be doped with the n type dopant, and the second barrier layer 173 of the active layer 107 adjacent to the second conductive type semiconductor layer 109 may have dopant concentration lower than that of other barrier layers. The dopant concentration of the second barrier layer 173 refers to the concentration of the n type dopant and/or the p type dopant.

In order to grow the active layer 107, the barrier layer 171 and the well layer 172 are alternately grown by selectively supplying NH3, TMGa (or TEGa), TMIn or TMAl at the first temperature T1 while employing nitrogen and/or hydrogen as carrier gas. The first temperature T1 is in the range of 700 to 800□. The growth temperature for the barrier layers 171 and 173 may be identical to or higher than the growth temperature for the well layer 172.

The growth rate of at least one well layer 172 is 0.01 nm/sec or less. The thickness of at least one well layer 172 is about 3 nm or more, preferably, 3 nm to 4 nm. Indium (In) composition in at least one well layer 172 is 12% or more. A single barrier layer or a multiple barrier layer can be formed on the well layer 172.

There is difference of In composition between the well layer 172 and the barrier layers 171 and 173. The In composition may be adjusted by controlling the flow rate of In during the thin film growing process. That is, in order to reduce the In composition, the growth temperature is raised or the flow rate of In is reduced. In detail, the barrier layers 171 and 173 can be grown by using the semiconductor material having the In composition lower than that of the material for the well layer 172.

The bandgap of the barrier layers 171 and 173 may be higher than the bandgap of the well layer 172.

In addition, the stabilization time is required when the well layer 172 and the barrier layers 171 and 173 are alternately grown to stabilize the growth temperature for each layer. For instance, the stabilization time is given in the period where the growth temperature for the barrier layer 171 is changed to the growth temperature for the well layer 172 or the growth temperature for the well layer 172 is changed to the growth temperature for the barrier layers 171 and 173. The active layer 107 can be formed by utilizing the stabilization time.

A second conductive clad layer can be formed between the second conductive type semiconductor layer 109 and the active layer 107. The second conductive clad layer may include a GaN-based semiconductor and have a bandgap greater than that of the barrier layers 171 and 173 formed in the active layer 107 to confine the carrier.

The second conductive type semiconductor layer 109 is formed on the active layer 107. The second conductive type semiconductor layer 109 may include group III-V compound semiconductor doped with second conductive dopant. For instance, the group III-V compound semiconductor may include one selected from the group consisting of GaN, AlN, AlGaN, InGaN, InN, InAlGaN, AlInN, AlGaAs, GaP, GaAs, GaAsP, and AlGaInP. Preferably, the second conductive type semiconductor layer 109 can be formed by using a semiconductor material having the compositional formula of $In_xAl_yGa_{1-x-y}N$ ($0 \leq x \leq 1$, $0 \leq y \leq 1$, $0 \leq x+y \leq 1$).

The second conductive type semiconductor layer 109 can be prepared as a single layer or a multiple layer. If the second conductive type semiconductor layer 109 is prepared as the multiple layer, the second conductive type semiconductor layer 109 may include a super lattice structure, such as AlGaN/GaN.

The second conductive layer 109 is a P type semiconductor layer doped with P type dopant, such as Mg, Be, or Zn. The second conductive layer 109 may serve as an electrode contact layer, but the embodiment is not limited thereto.

In addition, the light emitting structure layer 104 may have the first conductive type semiconductor layer 105 including the P type semiconductor and the second conductive type semiconductor layer 109 including the N type semiconductor. A third conductive type semiconductor layer (not shown) having the polarity opposite to that of the first conductive type semiconductor layer 105 can be formed on the second conductive type semiconductor layer 109.

Figure 2:
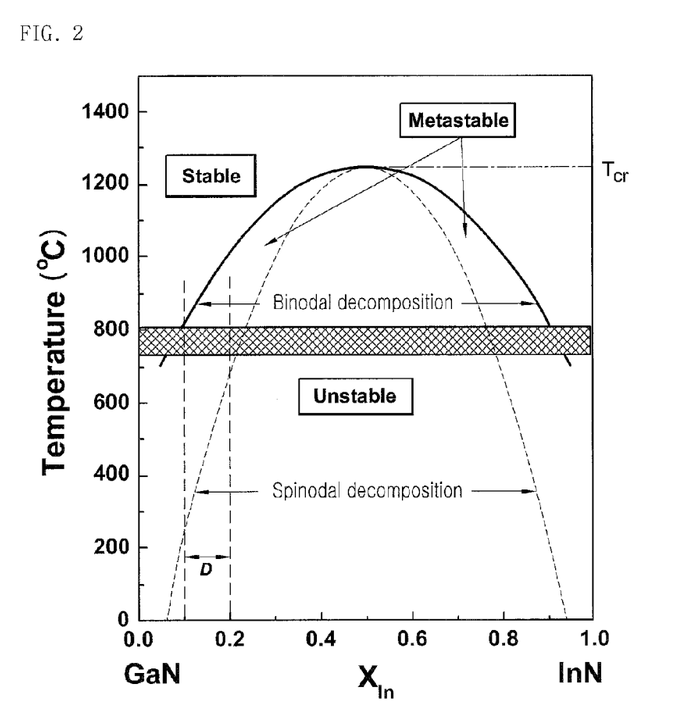
FIG. 2 is a phase diagram based on the growth temperature of an active layer and the contents of indium according to the embodiment.

As shown in FIG. 2, when the indium composition $X_{In}$ in the well layer 172 is in the range of 10 to 20%, the active layer 107 remains in the metastable region D1. However, if most properties have been determined in the process of growing the well layer 172 of the active layer 107, the wavelength rarely varies when the optimization is performed in the subsequent process after the active layer 107 has been grown.

According to the embodiment, the growth rate of the well layer 172 of the active layer 107 is 0.01 nm/sec or less, the thickness of the well layer 172 is 3 nm or more, and the In composition in the well layer 172 is 12% or more. In this case, the well layer 172 is grown and then the barrier layer 171 is grown after the stabilization time has lapsed. In this manner, the well layer 172 and the barrier layers 171 and 173 can be alternately grown. The barrier layers 171 and 173 may be thicker that the well layer 172. The well layer 172 satisfies the compositional formula of $In_xAl_yGa_{1-x-y}N$, wherein x is in the range of 0.12 to 0.2, preferably, 0.2 to 0.15.

After the active layer 107 has been grown, the thermal annealing process is performed to improve the optical characteristics. The thermal annealing process is performed at the second temperature T2 (T2>T1) to optimize the optical characteristics of the active layer 107. The second temperature T2 is higher than the growth temperature of the well layer 172 or the first temperature and set in the range of 800 to 1100□. The second temperature T2 may be changed depending on the growth temperature of the active layer 107. According to the embodiment, the thermal annealing process is performed after the active layer 107 has been completed grown and before the second conductive type semiconductor layer 109 is grown. The thermal annealing process may protect the well layer 172 of the active layer 107 and prevent atoms from being decomposed or evaporated while improving the interface characteristic, the optical characteristic and the thickness uniformity.

Meanwhile, at least one thermal annealing process is performed under the temperature higher than the growth temperature of the well layer 172 of the active layer 107, so that quality degradation of the well layer 172 can be prevented and the light efficiency can be improved. An In rich cluster, which is a high-density In cluster, or a quantum dot may be induced in at least one well layer 172. In order to facilitate the explanation, the high-density In cluster will be referred to as an In cluster. The In cluster has the In composition higher the In composition in the well layer 172. In addition, the In cluster has a size of 20 nm or less, preferably, 1 to 20 nm. The density of the In cluster in the well layer 172 may be $1E11/cm^2$ or more (for instance, $1E11/cm^2$ to $1E13/cm^2$). The indium cluster has a composition higher than an indium (In) composition in the $In_xAl_yGa_{1-x-y}N$ well layer.

The In clusters may have an irregular shape or a random shape and spaced apart from each other at a random interval.

In addition, the thermal annealing time is longer than the stabilization time of the active layer 107. For instance, the thermal annealing time is about 20 minutes.

The light emitting device having the above structure may have improved photo-luminescence intensity and durability against the electrostatic discharge (ESD) and electric characteristics of the light emitting device 100, such as the operation voltage, can be improved. Therefore, the light emitting device having the high photo-luminescence intensity and reliability can be provided. Due to the thermal annealing process, the light emitting device 100 can emit the light having energy lower than the bandgap of the intrinsic material of the active layer 107. The well layer 172 of the active layer 107 may have the bandgap of a rectangular type, a pyramidal type or a trapezoidal type.

Figure 3:
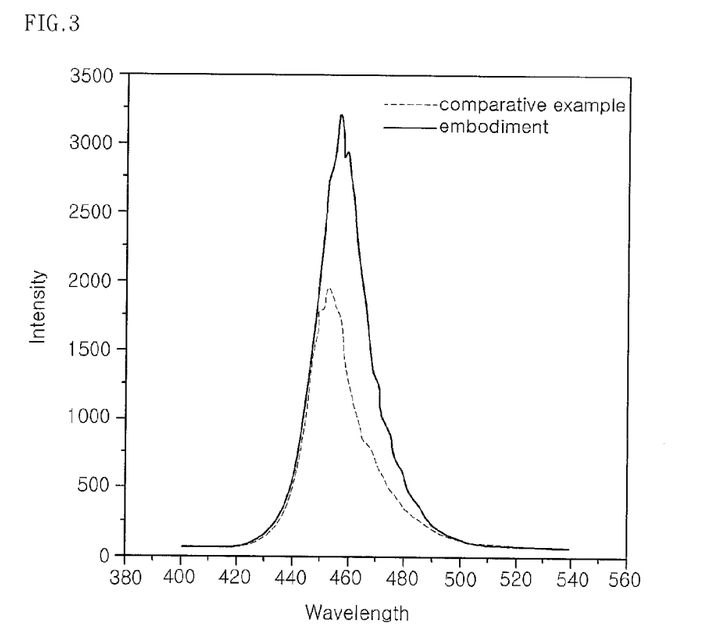
FIG. 3 is a graph showing PL intensity according to the embodiment and the comparative example.

As shown In FIG. 3, the wavelength of the light emitted from the active layer 107 may be lengthened by 1 nm or more and the photo-luminescence intensity of the light may be improved by about 10% or more.

Since the annealing process is performed after the active layer 107 has been formed, the light having the photo-luminance intensity suitable for the light emitting device can be emitted without P-AlGaN and/or a super lattice structure such as P-AlGaN/GaN, formed between the active layer 107 and the second conductive type semiconductor layer 109. In addition, the active layer 107 with optimal light emission can be provided even if an additional pattern, such as pattern sapphire substrate (PSS), is not formed on the substrate 101.

The defect density on the surface of the active layer 107, that is, the defect density on the uppermost surface is $1E8/cm^2$ or less. The defect density may include electric potential or V-pit. The second barrier layer 173 can be disposed at the uppermost layer of the active layer 107.

The defect density on the surface of the active layer 107, that is, the defect density on the surface of the second barrier layer 173 can be improved through the thermal annealing process. As the thermal annealing process is performed, atoms of In and Ga in the active layer 107 migrate to the defect region and are combined with each other, so that the defect density on the surface of the active layer 107 can be improved. In addition, the atoms of In and Ga are combined in the defect region through the thermal annealing process, so that the InGaN layer having high quality can be grown.

The defect density on the surface of the second barrier layer 173 of the active layer 107 may be lower than the defect density on the top surface or the lower surface of the first conductive type semiconductor layer 105. In addition, the defect density of the second barrier layer 173, which is nearer to the second conductive type semiconductor layer 109 than the first conductive type semiconductor layer 105, may be lower than the defect density of the barrier layer 171, which is nearer to the first conductive type semiconductor layer 105 than the second conductive type semiconductor layer 109.

Since the defect density on the surface of the active layer 107 can be reduced through the thermal annealing process, the active layer 107 having high quality can be provided. In addition, a low current and withstanding voltage, which is caused by the defect, can be prevented, so that the internal quantum efficiency of the active layer 107 can be improved.

As shown in FIG. 3, due to the well layer having the above structure and the thermal annealing process, the active layer according to the embodiment emits the light having the wavelength longer than that of the comparative example by 2.3 nm and the photo-luminescence intensity is increased by about 50% as compared with that of the comparative example. The comparative example is obtained under the conditions that the well layer has the thickness of 2 nm, and the In composition is 10%. The characteristics of the active layer are determined when the active layer is grown.

According to the embodiment, the active layer is optimized through the subsequent process after the well layer and the active layer have been grown under the predetermined conditions, so that the light emitting device can improve the photo-luminescent intensity while enhancing the durability against the ESD and the electric characteristics, such as the operational voltage. Thus, the light emitting device having the high photo-luminescent intensity and high reliability can be realized.

Table 1 shows the voltage, power and ESD characteristic of the embodiment and the comparative example.

TABLE 1

|  | Comparative example | Embodiment |
| --- | --- | --- |
| VF1 (20 mA) | 3.22 V | 3.1 V |
| VF2 (1 μA) | 2.25 V | 2.35 V |
| VR (−10 μA) | −20 V | −25 V |
| Po (20 mA) | Min: 11.9 mW | Min: 12.5 mW |
|  | Max: 12.9 mW | Max: 11.5 mW |
| ESD yield (−2 kV) | 4%/19%/5% | 80%/64%/45% |

In table 1, VF represents forward current, VF1 and VF2 represent forward voltage when predetermined current is applied, VR represents reverse voltage when predetermined current is applied, Po represents power, and ESD yield represents ESD characteristics under predetermined voltage. As can be understood from table 1, according to the embodiment, the forward voltage, the reverse voltage, the power and the ESD characteristics are improved as compared with the comparative example.

The In clusters having the size of 20 nm or less are formed in the active layer through the thermal annealing process. Therefore, the wavelength of light emitted from the active layer may be lengthened by about 1 nm or more, and PL intensity is improved by about 10% or more. The In clusters can be formed in the well layer 172 in the density of $1E11/cm^2$, preferably, $1E11/cm^2 \sim 1E13/cm^2$.

Figure 4:
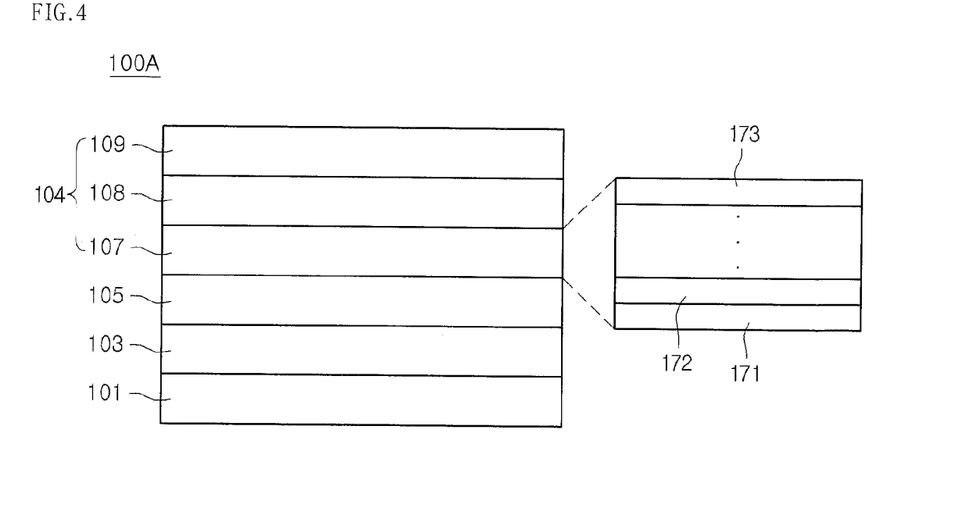
FIG. 4 is a sectional view showing a light emitting device according to the second embodiment.

FIG. 4 is a side sectional view showing a light emitting device according to the second embodiment. In the following description of the second embodiment, elements and structures that have been described in the first embodiment will be omitted in order to avoid redundancy.

Referring to FIG. 4, a semiconductor light emitting device 100A includes a substrate 101, a buffer layer 103, a first conductive type semiconductor layer 105, an active layer 107, a second conductive buffer layer 108 and a second conductive type semiconductor layer 109.

A light emitting structure layer 104 is obtained by forming the second conductive buffer layer 108 on the active layer 107 and forming the second conductive type semiconductor layer 109 on the second conductive buffer layer 108.

The growth method for the active layer 107 is similar to that of the first embodiment, so details thereof will be omitted in order to avoid redundancy. The thickness of the well layer 172 of the active layer 107 is at least 3 nm, the well layer 172 includes a material having the compositional formula of $In_xAl_yGa_{1-x-y}N$ ($0<x\leq1$, $0\leq y\leq1$, $0\leq x+y\leq1$) in which x is in the range of 0.12 to 0.2, and the In composition is at least 12%, preferably, 12~20%, more preferably, 12~15%.

The second conductive buffer layer 108 includes the group III-V compound semiconductor doped with second conductive dopant. For instance, the second conductive buffer layer 108 is prepared as a thin layer including InAlGN. In addition, the second conductive buffer layer 108 may include an InAlGaN layer or an AlGaN layer having a thickness of several tens of Å to few nm.

After the second conductive buffer layer 108 has been grown, the thermal annealing process is performed before the second conductive type semiconductor layer 109 is formed. The thermal annealing process is performed for 20 minutes at the temperature of 800~1100□. The thermal annealing temperature may be higher than the growth temperature of the active layer 107 or the second conductive buffer layer 108.

Due to the thermal annealing process, the number of quantum dots for enhancing the light efficiency can be increased in the well layer 172 of the active layer 107. According to the embodiment, the active layer 107 is optimized through the subsequent process after the well layer 172 and the active layer 107 have been grown under the predetermined growth conditions, so that the light emitting device can improve the photo-luminescent intensity while enhancing the durability against the ESD and the electric characteristics, such as the operational voltage. Thus, the light emitting device having the high photo-luminescent intensity and high reliability can be realized.

In addition, the defect density on the surface of the active layer 107, that is, the defect density on the surface of the uppermost barrier layer can be improved even if the thermal annealing process is performed after the second conductive buffer layer 108 has been formed. As the thermal annealing process is performed, atoms of In and Ga in the active layer 107 migrate to the defect region and are combined with each other, so that the defect density on the surface of the active layer 107 can be improved. The defect density of the active layer 107, that is, the V-pit density is $1E8/cm^2$ or less.

Since the defect density on the surface of the active layer 107 can be reduced through the thermal annealing process, the active layer 107 having high quality can be provided. In addition, degradation of the current and withstanding voltage, which is caused by the defect, can be prevented, so that the internal quantum efficiency of the active layer 107 can be improved.

The thermal annealing process can be performed after the active layer 107, the second conductive buffer layer 108, or the second conductive type semiconductor layer 109 has been grown, but the embodiment is not limited thereto.

Figure 5:
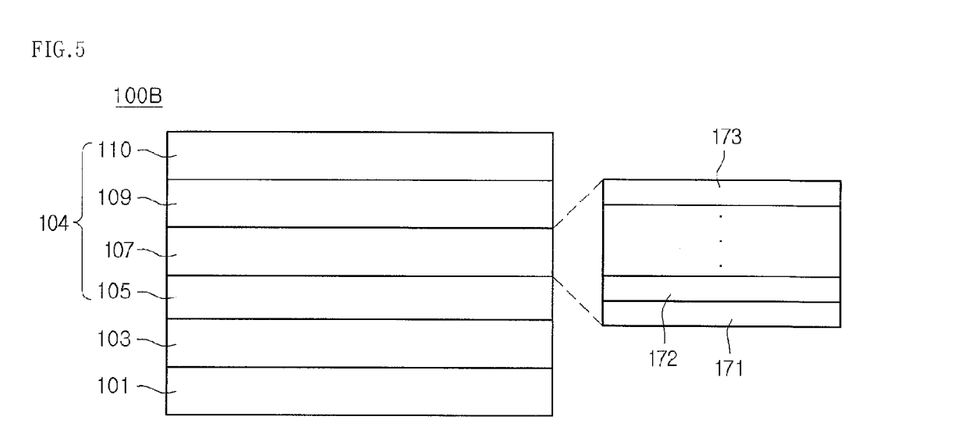
FIG. 5 is a sectional view showing a light emitting device according to the third embodiment.

FIG. 5 is a side sectional view showing a light emitting device according to the third embodiment. In the following description of the third embodiment, elements and structures that have been described in the first embodiment will be omitted in order to avoid redundancy.

Referring to FIG. 5, a semiconductor light emitting device 100B can be manufactured by sequentially growing a buffer layer 103, a first conductive type semiconductor layer 105, an active layer 107, second conductive type semiconductor layer 109 and a third conductive type semiconductor layer 110 on a substrate 101.

The growth method for the active layer 107 is similar to that of the first embodiment, so details thereof will be omitted in order to avoid redundancy. The thickness of the well layer 172 of the active layer 107 is at least 3 nm, the well layer 172 includes a material having the compositional formula of $In_xAl_yGa_{1-x-y}N$ ($0<x \leq 1$, $0 \leq y \leq 1$, $0 \leq x+y \leq 1$), and the In composition is at least 12%.

A light emitting structure layer 104 can be obtained by forming the second conductive type semiconductor layer 109 on the active layer 107 and forming the third conductive type semiconductor layer 110 on the second conductive type semiconductor layer 109. The third conductive type semiconductor layer 110 is a thin semiconductor layer doped with the first conductive dopant. The third conductive type semiconductor layer 110 may include the group III-V compound semiconductor including one selected from the group consisting of GaN, AlN, AlGaN, InGaN, InN, InAlGaN, AlInN, AlGaAs, GaP, GaAs, GaAsP, and AlGaInP.

After the second conductive type semiconductor layer 109 or the third conductive type semiconductor layer 110 has been grown, the thermal annealing process is performed. The thermal annealing process is performed for 20 minutes at the temperature of 800~1100□. The thermal annealing process induces the In cluster or the quantum dot in the well layer 172. The In cluster may improve the optical characteristics of the active layer 107. The thermal annealing temperature may be higher than the growth temperature of the well layer 172 of the active layer 107 or the second conductive type semiconductor layer 109.

In addition, the defect density on the surface of the active layer 107, that is, the defect density on the surface of the uppermost barrier layer 173 can be improved even if the thermal annealing process is performed after the second conductive type semiconductor layer 109 has been formed. As the thermal annealing process is performed, atoms of In and Ga in the active layer 107 migrate to the defect region and are combined with each other, so that the defect density on the surface of the active layer 107 can be improved. The defect density of the active layer 107, that is, the V-pit density is $1E8/cm^2$ or less.

Although it has been described that the thermal annealing process is performed after the third conductive type semiconductor layer 110 has been grown, it is also possible to perform the thermal annealing process before the third conductive type semiconductor layer 110 is grown or after the active layer 107 has been grown.

According to the embodiment, at least one of a transparent electrode layer, a reflective electrode layer and a second electrode can be formed on the second conductive type semiconductor layer 109 or the third conductive type semiconductor layer 110. The material and the structure of the above elements can be variously changed within the technical scope of the embodiment. In addition, features of each embodiment can be selectively adopted in other embodiments.

Figure 6:
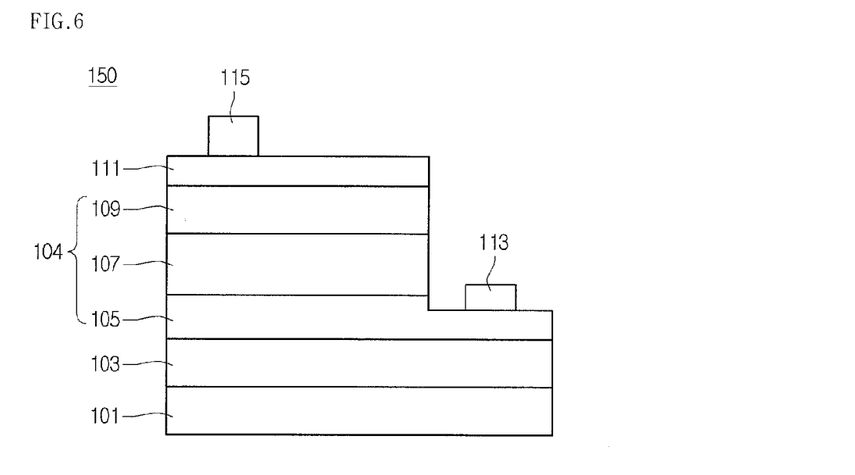
FIG. 6 is a sectional view showing a lateral electrode in a light emitting device of FIG. 1.

FIG. 6 is a sectional view showing a lateral electrode disposed in the light emitting device of FIG. 1.

Referring to FIG. 6, the light emitting device 150 includes an electrode layer 111 disposed on the second conductive type semiconductor layer 109 and a second electrode 115 electrically connected to the electrode layer 111. The second electrode 115 can be disposed on the electrode layer 111 and can be electrically connected to the electrode layer 111 and the second conductive type semiconductor layer 109. The second electrode 115 may include at least one selected from the group consisting of Ag, Ag alloy, Ni, Al, Al alloy, Rh, Pd, Ir, Ru, Mg, Zn, Pt, Au, Hf and an alloy thereof.

The electrode layer 111 may have the ohmic contact function and/or the transmittive function. The electrode layer 111 may be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

The first electrode 113 is electrically connected to the first conductive type semiconductor layer 105. The first electrode 113 can be disposed on the first conductive type semiconductor layer 105 and may include at least one selected from the group consisting of Ti, Al, In, Ta, Pd, Co, Ni, Si, Ge, Ag, Au, and an alloy thereof.

Figure 7:
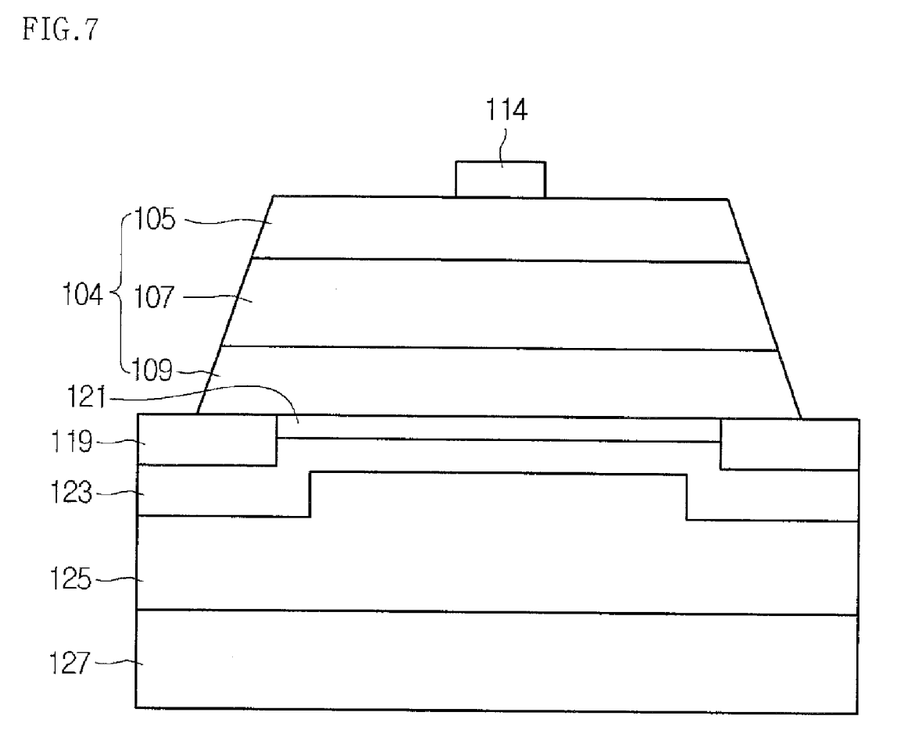
FIG. 7 is a sectional view showing a vertical electrode in a light emitting device of FIG. 1.

FIG. 7 is a sectional view showing another example of the light emitting device shown in FIG. 1.

Referring to FIG. 7, the light emitting device 151 includes a light emitting structure layer 104, a first electrode 114, a channel layer 119, a plurality of conductive layers 121, 123 and 125 and a support member 127.

The light emitting structure layer 104 includes the group II to VI compound semiconductor. For instance, the light emitting structure layer 104 can be formed by using the group III-V compound semiconductor. In addition, the light emitting structure layer 104 may include the semiconductor material having the compositional formula of $In_xAl_yGa_{1-x-y}N$ ($0 \leq x \leq 1$, $0 \leq y \leq 1$, $0 \leq x+y \leq 1$). Further, the light emitting structure layer 104 may include at least one selected from the group consisting of GaN, AlN, AlGaN, InGaN, InN, InAlGaN, AlInN, AlGaAs, GaP, GaAs, GaAsP, and AlGaInP.

The light emitting structure layer 104 includes the first conductive type semiconductor layer 105, the active layer 107 and the second conductive type semiconductor layer 109, in which the active layer 107 is interposed between the first and second conductive type semiconductor layers 105 and 109. In addition, the light emitting structure layer 104 may further include a third semiconductor layer, which is disposed under the second conductive type semiconductor layer 109 with polarity opposite to that of the second conductive type semiconductor layer 109.

A first electrode 114 is formed on the top surface of the first conductive type semiconductor layer 105. A roughness can be formed on a part or a whole area of the top surface of the first conductive type semiconductor layer 105. Another semiconductor layer, such as an undoped semiconductor layer having dopant concentration lower than that of the first conductive type semiconductor layer 105 or a low-conductive type semiconductor layer, can be formed between the first electrode 114 and the first conductive type semiconductor layer 105.

The top surface of the first conductive type semiconductor layer 105 is an N-Face surface to which the first electrode 114 is connected. The first electrode 114 has an ohmic contact function and a part of which is used as a bonding pad. The first electrode 114 can be prepared as a single layer structure or a multiple layer structure and an arm electrode having a predetermined line width can be electrically connected to the first electrode 114. The first electrode 114 may include one selected from the group consisting of Cr, Ti, Al, In, Ta, Pd, Co, Ni, Si, Ge, Ag, Cu, Au and a mixture thereof.

The active layer 107 is formed under the first conductive type semiconductor layer 105.

The second conductive type semiconductor layer 109 is formed under the active layer 107.

A lateral side of the light emitting structure may be inclined or perpendicular to the lower surface of the second conductive type semiconductor layer 109.

The channel layer 119 and the first conductive layer 121 are formed under the second conductive type semiconductor layer 109. An inner portion of the channel layer 119 is disposed between the second conductive type semiconductor layer 109 and the first conductive layer 121, and an outer portion of the channel layer 119 is exposed out of the light emitting structure 104. The lower surface of the outer portion of the channel layer 119 may come into contact with the top surface of the first conductive layer 121. The channel layer 119 may include an insulating material or a conductive oxide material. For instance, the channel layer 119 may include one selected from the group consisting of ITO, IZO, IZON, IZTO, IAZO, IGZO, IGTO, AZO, ATO, GZO, $SiO_2$, $SiO_x$, $SiO_xN_y$, $Si_3N_4$, $Al_2O_3$, and $TiO_2$.

The conductive layers are spaced apart from the light emitting structure 104 by the channel layer 119. In addition, the channel layer 119 may improve the adhesive property with respect to the second conductive type semiconductor layer 109.

The first conductive layer 121 may include an ohmic layer. The ohmic layer makes ohmic-contact with the lower surface of the second conductive type semiconductor layer 109. The ohmic layer may include one selected from the group consisting of ITO, IZO, IZON, IZTO, IAZO, IGZO, IGTO, AZO, ATO, and GZO. In addition, the ohmic layer may include a metal, such as Ni or Ag.

The second conductive layer 123 is disposed under the first conductive layer 121. The second conductive layer 123 may include a metal having reflectance of about 50% or more. For instance, the second conductive layer 123 may include at least one selected from the group consisting of Ag, Ni, Al, Rh, Pd, Ir, Ru, Mg, Zn, Pt, Au, Hf, and a combination thereof.

At least one of the first and second conductive layers 121 and 123 may extend below the channel layer 119.

The third conductive layer 125 is prepared as a barrier layer or a bonding layer under the second conductive layer 123. The third conductive layer 125 may include at least one selected from the group consisting of Ti, Au, Sn, Ni, Cr, Ga, In, Bi, Cu, Ag, and Ta.

The support member 127 is formed under the third conductive layer 125. The support member 127 may include a conductive material. For instance, the support member 127 may include Cu, Au or a carrier wafer such as Si, Ge, ZnO or SiC. The support member 127 may be omitted depending on the thickness or strength of the support member 127, or may include two layers which are integrally formed as a single layer. For example, the support member 127 may include a conductive sheet or an insulating material.

Figure 8:
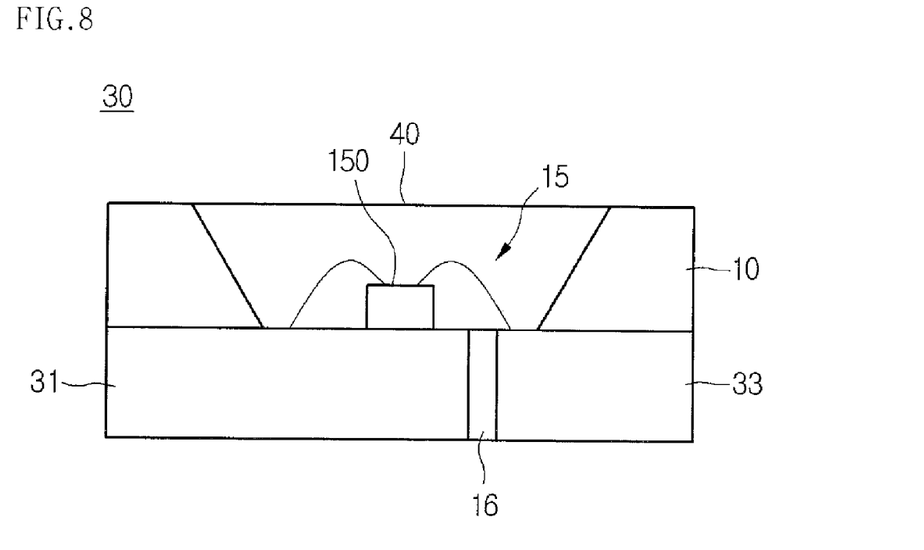
FIG. 8 is a sectional view showing a light emitting device package including a light emitting device illustrated in FIG. 6.

FIG. 8 is a sectional view showing a light emitting device package according to the embodiment.

Referring to FIG. 8, the light emitting device package 30 includes a body 10, first and second lead electrodes 31 and 33 formed on the body 10, the light emitting device 150 provided on the body 10 and electrically connected to the first and second lead electrodes 31 and 33 and a molding member 40 that surrounds the light emitting device 150.

The body 10 may be a conductive substrate including silicon, a synthetic resin substrate including PPA (Polyphthalamide), a ceramic substrate, an insulating substrate, or a metal substrate such as an MCPCB (metal core PCB). A cavity 15 can be formed in the body 10 and a division part 16 can be formed between the first and second lead electrodes 31 and 33. An inclined surface may be formed around the cavity 15. The body 10 may have a through-hole structure, but the embodiment is not limited thereto.

The first and second lead electrodes 31 and 33 are electrically isolated from each other to supply power to the light emitting device 150. In addition, the first and second lead electrodes 31 and 33 reflect the light emitted from the light emitting device 150 to improve the light efficiency and dissipate heat generated from the light emitting device 150 to the outside.

The light emitting device 150 can be installed on the body 10 or the first or second electrode 31 or 33.

The light emitting device 150 is electrically connected to the first lead electrode 31 through a wire and electrically connected to the second electrode 33 through the die bonding scheme.

The molding member 40 surrounds the light emitting device 150 to protect the light emitting device 150. In addition, the molding member 40 may include luminescence materials to change the wavelength of the light emitted from the light emitting device 150. A lens can be formed on the molding member 40. The lens may come into contact with the molding member 40 or may be spaced apart from the molding member 40.

The light emitting device 150 can be electrically connected to the lower surface of the body or the substrate by way of the through hole.

At least one light emitting device according to the embodiment can be mounted in the light emitting device package, but the embodiment is not limited thereto.

Although the top-view type light emitting device package is disclosed in the embodiment, the side-view type light emitting device package can be used to improve the heat dissipation, conductivity and reflective characteristics. According to the top-view type light emitting device package or the side-view type light emitting device package, the light emitting device is packaged by using the resin layer and then the lens is formed on or bonded to the resin layer, but the embodiment is not limited thereto.

<Lighting System>

The light emitting device or the light emitting device package according to the embodiment can be applied to the light unit. The light unit includes a plurality of light emitting devices or a plurality of light emitting device packages which are arrayed in the light unit. The light unit may include a lighting lamp, a signal lamp, a headlight of a vehicle, and an electric signboard.

Figure 9:
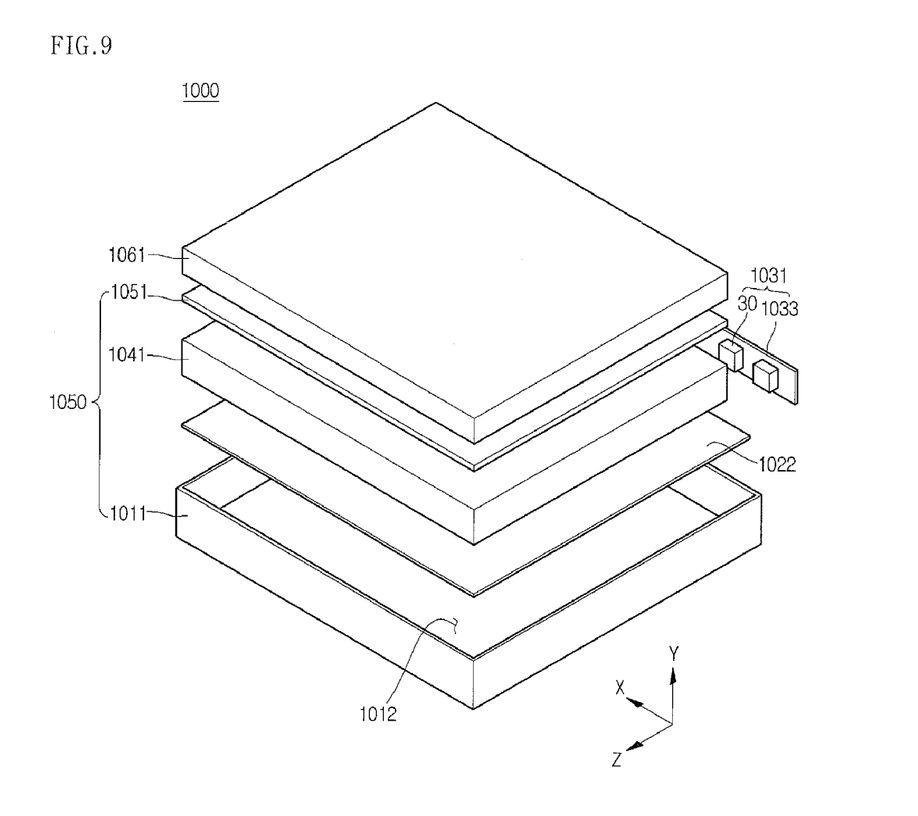
FIG. 9 is a diagram illustrating a display device according to an embodiment.
Figure 10:
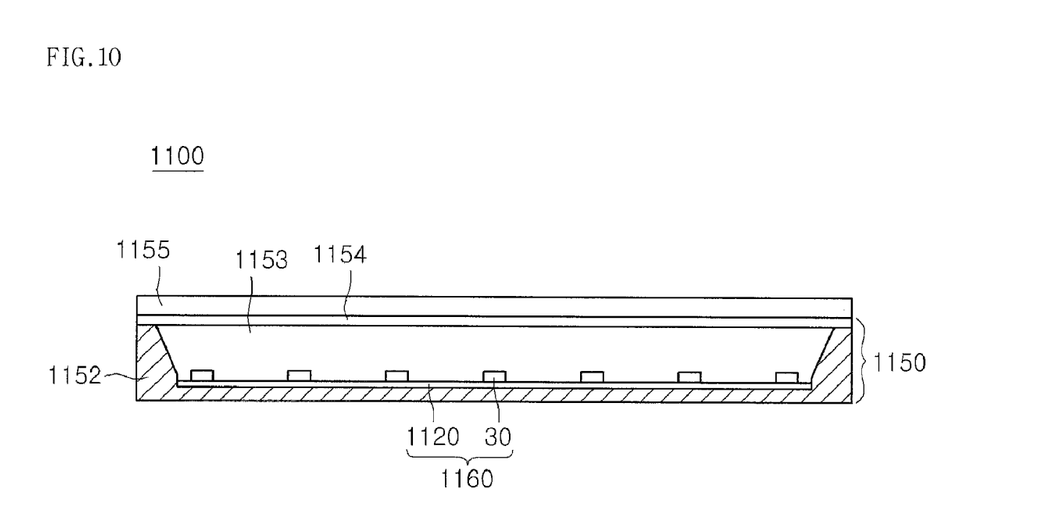
FIG. 10 is a diagram illustrating another display device according to an embodiment.
Figure 11:
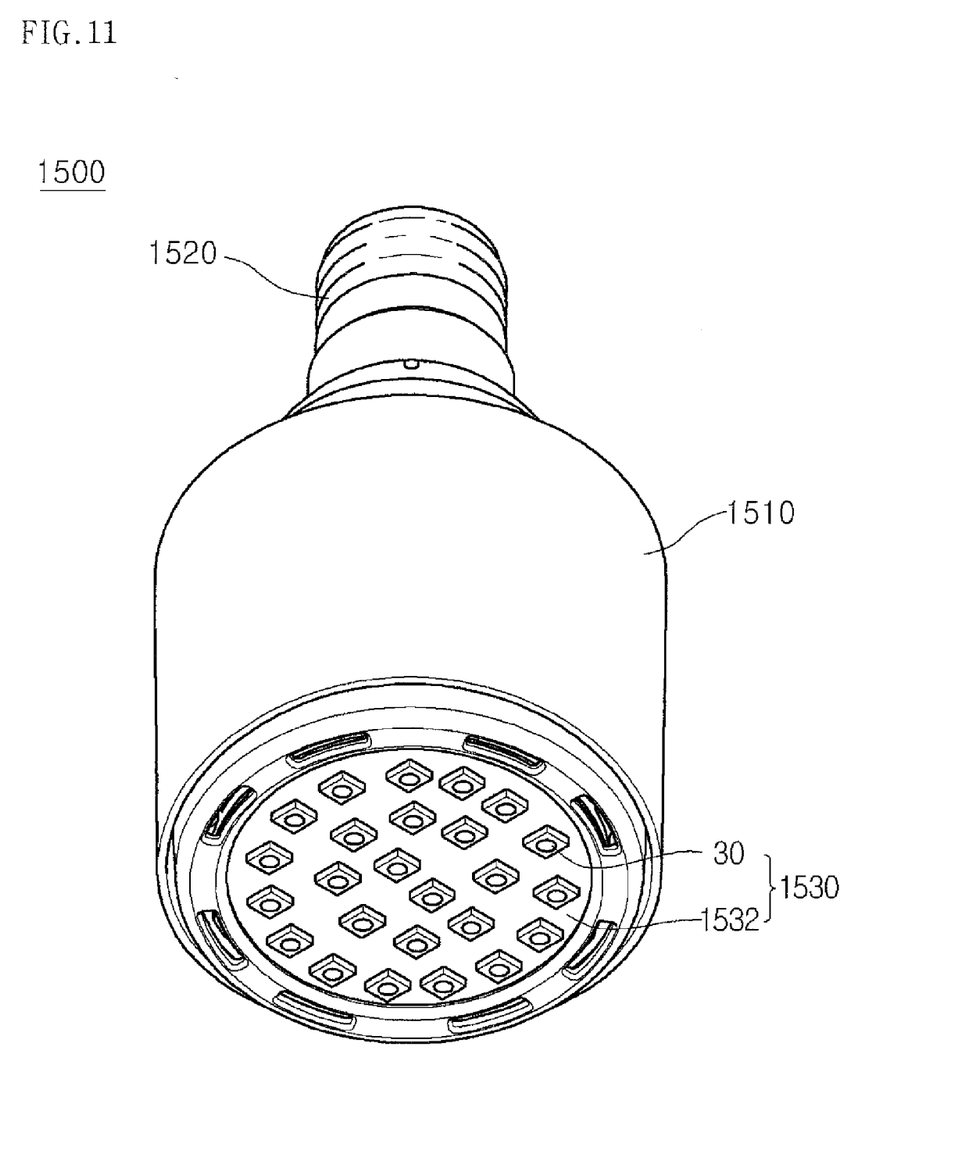
FIG. 11 is a diagram illustrating an illumination device according to an embodiment.

The illumination system may include display devices illustrated in FIGS. 9 and 10, an illumination device illustrated in FIG. 11, illumination lamps, signal lights, car headlights, electronic displays, and the like.

FIG. 9 is an exploded perspective view illustrating a display device according to an embodiment.

Referring to FIG. 9, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 30 according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 10 is a diagram illustrating a display device according to an embodiment.

Referring to FIG. 10, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 11 is a perspective view illustrating an illumination device according to an embodiment.

Referring to FIG. 11, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

The method of manufacturing the light emitting device according to the embodiment includes the steps of forming a first conductive type semiconductor layer on a substrate, forming an active layer having a well layer and a barrier layer, which are alternately disposed, on the first conductive type semiconductor layer, and forming at least one second conductive type semiconductor layer on the active layer. The well layer includes an In cluster having density of at least $1E11/cm^2$.

The embodiment can improve the intensity of the peak wavelength. The embodiment can shift the short wavelength into the long wavelength by performing the thermal annealing process when the active layer is grown. The embodiment can improve the durability against the ESD. The embodiment can improve the electric characteristic, such as the operation voltage.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
  a first conductive type semiconductor layer;
  an active layer including a plurality of barrier layers and a plurality of well layers alternately disposed on the first conductive type semiconductor layer; and
  a second conductive type semiconductor layer on the active layer,
  wherein at least one well layer includes an indium cluster having a density of $1E11/cm^2$ to $1E13/cm^2$.

2. The light emitting device of claim 1, wherein the well layer includes a material having a compositional formula of $In_xAl_yGa_{(1-x-y)}N$ ($0<x\leq1$, $0\leq y\leq1$, $0\leq x+y\leq1$).

3. The light emitting device of claim 1, wherein at least one indium cluster of the well layer has a size of 20 nm or less.

4. The light emitting device of claim 1, wherein the indium cluster of the well layer has an irregular shape or a random shape.

5. The light emitting device of claim 2, wherein the indium cluster has an composition higher than an indium (In) composition in the at least one well layer.

6. The light emitting device of claim 1, wherein an indium composition in the well layer is in a range of 10% to 20%.

7. The light emitting device of claim 1, wherein the well layer has a thickness of at least 3 nm.

8. A light emitting device comprising:
  a first conductive type semiconductor layer;
  an active layer including a barrier layer and a well layer alternately disposed on the first conductive type semiconductor layer; and
  a second conductive type semiconductor layer on the active layer,
  wherein at least one well layer includes an indium cluster having a density of $1E11/cm^2$ to $1E13/cm^2$, and
  a defect density on a surface of the active layer is lower than a defect density on a surface of the first conductive type semiconductor layer.

9. The light emitting device of claim 8, wherein the defect density on the surface of the active layer is $1E8/cm^2$ or less.

10. The light emitting device of claim 8, wherein an uppermost layer of the active layer is a first barrier layer and the defect density of the active layer is obtained from a surface of the first barrier layer.

11. The light emitting device of claim 8, wherein the first conductive type semiconductor layer includes an N type semiconductor layer and the second conductive type semiconductor layer includes a P type semiconductor layer.

12. The light emitting device of claim 8, further comprising a second conductive buffer layer between the active layer and the second conductive type semiconductor layer, wherein the second conductive buffer layer includes InAlGaN or AlGaN.

13. The light emitting device of claim 8, further comprising a third conductive type semiconductor layer on the second conductive type semiconductor layer, wherein the third conductive type semiconductor layer has a polarity opposite to a polarity of the second conductive type semiconductor layer.

14. The light emitting device of claim 8, wherein the active layer has a stack structure including an $In_aAl_bGa_{(1-a-b)}N$ barrier layer/an $In_xAl_yGa_{(1-x-y)}N$, in which $0\leq a\leq1$, $0\leq b\leq1$, $0\leq a+b\leq1$, $0<x\leq1$, $0\leq y\leq1$, and $0\leq x+y\leq1$.

15. The light emitting device of claim 8, wherein at least one well layer has a thickness of 3 nm to 4 nm which is thinner than a thickness of the barrier layer.

16. The light emitting device of claim 8, wherein the well layer and the barrier layer are repeatedly disposed by 20 times or less.

17. The light emitting device of claim 8, wherein the barrier layer closer to the first conductive type semiconductor layer than the second conductive type semiconductor layer includes an n type dopant.

18. The light emitting device of claim 8, wherein the defect density of the barrier layer nearer to the second conductive type semiconductor layer than the first conductive type semiconductor layer is lower than the defect density of the barrier layer nearer to the first conductive type semiconductor layer than the second conductive type semiconductor layer.

19. The light emitting device of claim 8, further comprising an electrode layer on the second conductive type semiconductor layer.

20. A light emitting device package comprising:
a body;
a plurality of lead electrodes on the body;
a light emitting device disposed on at least one of the lead electrodes and electrically connected to the lead electrodes; and
a molding member for molding the light emitting device,
wherein the light emitting device comprises:
a first conductive type semiconductor layer;
an active layer including a barrier layer and a well layer alternately disposed on the first conductive type semiconductor layer; and
a second conductive type semiconductor layer on the active layer, and
wherein at least one well layer includes an indium cluster having a density of $1E11/cm^2$ to $1E13/cm^2$.

* * * * *